US009337615B2

(12) United States Patent
Iakovlev et al.

(10) Patent No.: US 9,337,615 B2
(45) Date of Patent: May 10, 2016

(54) VERTICAL CAVITY SURFACE EMITTING LASER CAVITY WITH LOW THERMAL IMPEDANCE

(75) Inventors: Vladimir Iakovlev, Ecublens (CH); Pascal Gallo, Lausanne (CH); Elyahou Kapon, Lausanne (CH); Tomasz Czyszanowski, Lodz (PL); Maciej Dems, Lodz (PL); Michal Wasiak, Lodz (PL); Jaroslaw Walczak, Lodz (PL)

(73) Assignee: ECOLE POLYTECHNIQUE FEDERALE DE LAUSANNE (EPFL) (CH)

( * ) Notice: Subject to any disclaimer, the term of this patent is extended or adjusted under 35 U.S.C. 154(b) by 93 days.

(21) Appl. No.: 13/558,628

(22) Filed: Jul. 26, 2012

(65) Prior Publication Data
US 2013/0028279 A1 Jan. 31, 2013

(30) Foreign Application Priority Data

Jul. 27, 2011 (EP) ..................................... 11175559

(51) Int. Cl.
| H01S 3/04 | (2006.01) |
| H01S 5/024 | (2006.01) |
| H01S 5/04 | (2006.01) |
| H01S 5/14 | (2006.01) |
| H01S 5/183 | (2006.01) |
| B82Y 20/00 | (2011.01) |
| H01S 5/00 | (2006.01) |
| H01S 5/02 | (2006.01) |
| H01S 5/022 | (2006.01) |
| H01S 5/343 | (2006.01) |

(52) U.S. Cl.
CPC ............. *H01S 5/02484* (2013.01); *B82Y 20/00* (2013.01); *H01S 5/0213* (2013.01); *H01S 5/041* (2013.01); *H01S 5/141* (2013.01); *H01S 5/18319* (2013.01); *H01S 5/0035* (2013.01); *H01S 5/0217* (2013.01); *H01S 5/02272* (2013.01); *H01S 5/02469* (2013.01); *H01S 5/34366* (2013.01)

(58) Field of Classification Search
CPC . H01S 3/06535; H01S 5/022; H01S 5/02484; H01S 5/041; H01S 5/0213; H01S 5/34366; H01S 5/0035; H01S 5/0127; H01S 5/02272; H01S 5/02469
USPC ........................................ 359/344; 372/70, 71
See application file for complete search history.

(56) References Cited

U.S. PATENT DOCUMENTS

| 2005/0190810 | A1* | 9/2005 | Butterworth | ........ H01S 5/02484 |
| | | | | 372/70 |
| 2006/0251140 | A1* | 11/2006 | Lee | .......................... H01S 5/183 |
| | | | | 372/70 |
| 2008/0037936 | A1* | 2/2008 | Lee | ..................... G02B 6/12028 |
| | | | | 385/37 |
| 2011/0069729 | A1* | 3/2011 | Strittmatter | ............ B82Y 20/00 |
| | | | | 372/45.01 |
| 2012/0269216 | A1* | 10/2012 | Govorkov | .............. B82Y 20/00 |
| | | | | 372/36 |

* cited by examiner

*Primary Examiner* — Tuan Nguyen
(74) *Attorney, Agent, or Firm* — Sheridan Ross P.C.

(57) ABSTRACT

The present invention concerns new designs of VCLs with high contrast gratings (HCG) combined with diamond layer as a bottom mirror. They can be realized either with a classical V-shaped pumping scenario, or through the introduction of the pumping beam from the bottom direction, through the HCG that can be designed to be transparent at the wavelength of the pumping light. They can also be completed by a HCG combined with diamond layer as top mirror, reflecting the pump diode laser and transparent to the VCL emission in the case the pumped and emitted beams are collinear.

18 Claims, 6 Drawing Sheets a)

b)

c)

VERTICAL CAVITY SURFACE EMITTING LASER CAVITY WITH LOW THERMAL IMPEDANCE

CROSS-REFERENCE TO RELATED APPLICATION

The present application claims the benefit of the priority of European patent application Number 11175559.1, filed on Jul. 27, 2011 in the name of Assignee ECOLE POLYTECHNIQUE FEDERALE DE LAUSANNE (EPFL), the entire disclosure of which is incorporated herein by reference.

FIELD OF THE INVENTION

The present invention concerns new designs of vertical cavity laser (VCL) that can be formed in vertical-(external)-cavity surface-emitting lasers (VECSEL or VCSEL) configurations with low thermal impedance cavity.

The invention is addressing (i) the problem of reducing thermal impedance of the laser cavity in order to reach higher power and improve stability, and (ii) the problem of reducing size and increasing the wall plug efficiency of the device.

The most common approach of designing vertical laser cavity for high output power is a classical V-shaped pumping scenario, or through the introduction of the pumping beam collinear with output beam, through the laser cavity mirror. In both cases the minimization of the thermal impedance is necessary for increasing output power.

As the mirrors are fabricated from solid state materials, the material of choice for such a mirror will be diamond, the material with the highest known thermal conductivity, with a moderate refractive index, provided that diamond will be arranged in the design with high reflectivity for output beam and low reflectivity for pumping beam.

Having such mirrors one can arrange the pumping from the bottom direction, through the mirror designed to be transparent at the wavelength of the pumping light.

Such a bottom-pumped device can serve as compact laser beam transformer attached to the end of fiber or directly connected to output mirror of the pump laser. Alignment of the pumped and pumping lasers can be assured by the use of appropriate connectors.

BACKGROUND OF THE INVENTION

Modern semiconductor lasers (SL) cover broad spectrum range from UV to mid-IR. The compact size, efficient light generation, low cost of manufacturing and maintaining have become a key to successful commercial applications of SL. The main shortcoming of SL is its low emitted power value (below 1 W, as compared with solid state lasers (SSL), which can reach several kW). However SSL emission wavelengths are restricted only to discrete values of electronic transitions in ions.

Vertical-external-cavity surface-emitting lasers (VECSEL) combine the advantages of SSL and SL in one device. Optically pumped VECSELs offer fundamental transverse mode operation, circular optical beam and scaling of the emitted power from one tenth up to tens of watts. Such efficient power scaling in a range of four orders of magnitude and maintaining good beam quality with a low divergence is enabled by the laser mode and pump spot-size scalability on the VECSEL semiconductor laser chip. VECSELs give access to wide output wavelength range by gain media engineering and capability to determine the specific desired wavelength by means of intra-cavity tunable filters, control of transverse modes realized by the optical cavity. Open laser cavity allows for laser beam interaction with optical elements, such as nonlinear optical crystals for higher harmonics generation, saturable absorbers for short pulse passive mode locking, etc.

Since VECSELs are designed for high-power operation, the thermal management issue is of major importance. Typically 30% power of pump light is transformed into the output light, 20% is reflected back from the chip and 50% percent is wasted as heat. The improvement of heat transport from the active mirror to the heat-sink can increase the efficiency of the device and will assure more stable laser action.

SUMMARY OF THE INVENTION

As mentioned above, the present invention concerns new designs of VCL lasers for example in VECSEL or VCSEL configurations with high thermal conductivity of the mirrors.

The use of high contrast gratings (HCG) combined with diamond layer is an embodiment of the invention. Using such mirrors one can realize either a classical V-shaped pumping scenario, or the scenario of introduction of the pumping beam from the bottom direction, through the HCG that can be designed to be transparent at the wavelength of the pumping light. Bottom-pumped device can serve as compact laser beam transformer (attached to the end of fiber for example. Alignment of the device and of the fiber providing pumping beam can be ensured by the use of appropriate connectors). The exploitation of high contrast gratings allows replacing poor thermally conductive DBR with bottom diamond heat-spreader, which reduces by 25% the thermal impedance of the device.

Calculations and experiments have confirmed that 300 μm top diamond heat-spreader ensures efficient heat dissipation and bottom diamond should be 250 μm and 450 μm in the Type 2 (V-type) and Type 3 (bottom-pumped), respectively, to assure best thermal performance.

In addition the present invention demonstrates that HCG realized with silicon stripes buried in diamond provide very narrow reflection spectrum, which can be exploited as spectral filter. HCG attached to the bottom of the diamond layer provides much broader high reflectivity spectrum region and low reflectivity spectral regions that can be used for introducing pumping beam. HCG also allows tailoring the polarization and pattern of the output beam.

In an embodiment, the invention concerns a vertical-cavity laser (VCL) comprising at least a heat sink with a reflector, an active region, a heat spreader wherein the reflector is formed by a high thermal conductive material layer and a high contrast grating.

In another embodiment the invention concerns a vertical-cavity laser (VCL) comprising at least a heat sink with a reflector, an active region, a heat spreader, wherein the reflector is formed by a high thermal conductive material layer and a high contrast grating and wherein the pumping beam and the emitted beam are oriented in a same direction along the VCL axis.

In an embodiment of the laser the high thermal conductive material may be diamond.

In an embodiment of the laser the heat spreader may comprise a diamond layer.

In an embodiment of the laser the high contrast grating may be a Si grating.

In an embodiment of the laser the heat sink may be a copper support.

In an embodiment of the laser the copper support may have an opening for allowing the passage of the pumping beam.

The laser may be formed in a vertical-external cavity surface emitting laser (VECSEL) configuration or in a vertical cavity surface emitting laser (VCSEL) configuration.

The invention will be better understood from the detailed description of different embodiments and from the appended drawings which show FIGS. 1(a) to 1(c) illustrate different embodiments of the invention;

DETAILED DESCRIPTION OF THE INVENTION

Figure 1:
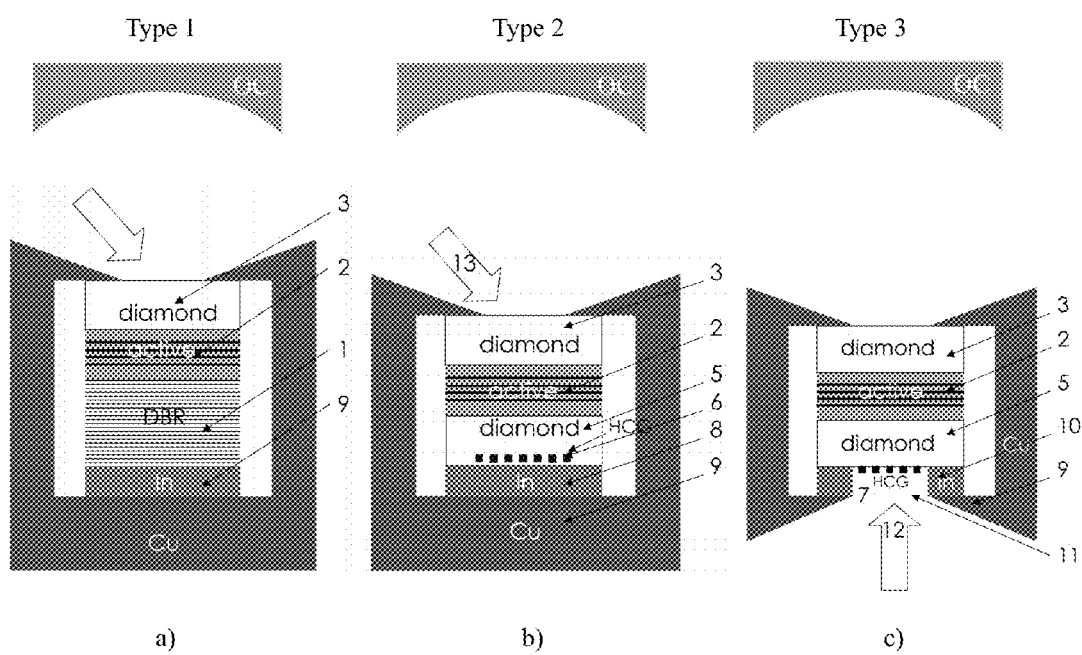

The present application discloses new, optimized VCL lasers as Vertical-external-cavity surface-emitting lasers (VECSEL) embodiments aimed for very low thermal resistance and portability.

Typically in an embodiment, active mirror designs comprise three main parts: a distributed Bragg reflector (DBR) 1, a multi-active region cavity 2 and heat-spreader 3 (see FIG. 1a).

The function of the heat spreader is to enhance the heat transport from central region of the chip to distant lateral regions and inject the heat back into the heat-sink direction. Hence heat becomes redistributed and then can be transported wide path to the heat-sink.

Such mechanism contributes to the more uniform temperature distribution within semiconductor cavity and assures relatively low increase of the temperature within active region. Presently, the most common heat-spreaders 3 are top diamond layers, accompanied by additional techniques (like substrate thinning) used to reduce thermal resistivity of the devices [see reference 1].

Due to the properties of the heat transfer, the most effective heat dissipation requires the heat-sink to be placed in the nearest proximity of the active region 2. However, in nearly all VECSEL designs, they are separated by the DBR 1 that is necessary to reflect the emitted laser beam and form the cavity. Since the best known DBRs 1 are fabricated from low thermal conductivity materials, in a first embodiment of the invention, we propose to replace it by a diamond layer 5 that has the highest known thermal conductivity and to introduce a high contrast grating (HCG) 6 [see references 2, 3] as the bottom mirror. This embodiment is illustrated in FIG. 1b.

The benefits coming from the HCG application in VECSEL are: the polarization discrimination, which is an inherent property of HCG, and additional reduction of the thermal resistivity since HCG is twenty times thinner than typical DBR. In this application we propose two new VECSEL embodiments based on gain region sandwiched by diamond heat-spreaders with HCG responsible for the efficient light reflection (see FIGS. 1b and 1c).

The first proposed embodiment (FIG. 1b) is a V-type structure, while in the second embodiment (FIG. 1c), the pumping and the emission take place in the same axis.

FIG. 1 illustrates schematic embodiments of the invention:

1(a) typical V-type structure with bottom DBR as known in the art,

1(b) modified V-type structure with HCG 6 buried in a diamond layer 5 as a bottom mirror,

1(c) bottom-pumped design with HCG 7 deposited on a diamond layer 7.

Arrow shows the direction of pumping light, OC being the output coupler, In indicating an indium solder. Solder in this place is used as a bonding material, Indium is chosen because it is a well known material suitable for this purpose. Other equivalent materials may be used or even one may build the assembly without solder(s), by simply applying a mechanical force in a fixture properly designed for this purpose.

Simulations of the thermal properties of the proposed cavities were calculated using a model comprising a three-dimensional (3D) vectorial optical model (the Plane Wave Admittance Method) [see reference 4], a finite element thermal model, and a gain model based on Fermi's golden rule [see reference 5].

The advanced optical model is essential to determine the reflectivity of HCG which is very demanding with respect to the accuracy of the optical approach. In the thermal model the determination of the heat sources is based on the distribution of the absorbed Gaussian pump beam in all the layers. The absorption taking part in the cavity contributes to the excitation of the electrons to the conduction band. The position of heat sources in cavity is determined by the lifetime of electrons. If lifetime is assumed to be very short, then electrons from barriers recombine in the non-radiative way instantly. Long lifetime allows all the electrons thermalize to the quantum wells and there recombine in the non-radiative way. In the thermal model first scenario causes that heat sources are distributed over whole cavity, in the second, the heat sources are located only in the quantum wells. The temperature distributions determined for both scenarios are very close and electron's lifetime is of less importance for thermal considerations.

TABLE 1

Layers thickness for all types of considered VECSELs, the geometry of Si stripes is given in the last row where d—width of stripes, L—distance between stripes and h—horizontal thickness of stripes

| | | Thickness [μm] | |
|---|---|---|---|
| Material | Type 1 | Type 2 | Type 3 |
| Diamond | | 300 | |
| InP window layer | | 0.24634 | |
| AlInGaAs spacer | | 0.2097 | |
| AlInGaAs barrier | × 4 | 0.01 | |
| AlInGaAs QW | | 0.0065 | |
| AlInGaAs barrier | | 0.01 | |
| AlInGaAs QW | | 0.0065 | |
| AlInGaAs barrier | | 0.01 | |
| AlInGaAs spacer | | 187.62 | |
| AlInGaAs barrier | | 0.01 | |
| AlInGaAs QW | | 0.0065 | |
| AlInGaAs barrier | | 0.01 | |
| AlInGaAs QW | | 0.0065 | |
| AlInGaAs barrier | | 0.01 | |
| AlInGaAs spacer | | 0.2097 | |
| InP cap layer | | 0.23617 | |
| InGaAsP cap | | 0.01 | |
| GaAs | × 33 | 0.1149 | |
| $Al_{0.9}Ga_{0.1}As$ | | 0.1339 | |
| Diamond | | 250 | 450 |
| Si | | d = 0.24, | d = 0.37, |
| | | L = 0.36 | L = 0.31 |
| | | h = 0.3 | h = 0.47 |

The remaining heat generation taking place out of the cavity is only 4% of all heat generated in the structure.

In the presented analysis we consider three designs (FIG. 1, Table 1) of VECSEL active mirror. Their common element is AlInGaAs gain region composed of five double quantum wells emitting light of 1.55 μm wavelength. Five pairs of quantum wells are placed in the successive antinodes of the standing wave. Another common element is a diamond heat-spreader layer which covers the active region from the top.

The structure Type 1 (FIG. 1a) is the conventional design with bottom DBR realized by the wafer-fused GaAs/AlAs periodic system. The GaAs substrate is thinned and the chip is soldered to the copper heat-sink by 5 μm thick indium. Type 1 is considered as a reference design in the analysis.

Realization of such Type 1 device has already been achieved and allowed reaching 6.6 W CW operation at 1.3 μm [see reference 6].

In Type 2 (FIG. 1b) the bottom DBR 1 is replaced with the diamond layer 5 with buried Si based HCG 6. Similarly to Type 1 it is soldered to the heat-sink with the aid of 5 μm thick indium 8.

The application of HCG opens new possibilities toward more versatile designs since it allows for spectral engineering of the reflectivity. This virtue is exploited in Type 3 (FIG. 1c), where the pumping and emitted beams are oriented in the same direction along the VECSEL axis. In this embodiment the bottom diamond 5 is capillary bounded to the gain region. The structure is also soldered to the heat-sink but the circular hole of 1 mm diameter has to be drilled in the copper support 9 and indium 10 to create the window 11 for the pumping beam 12. Such an embodiment allows simplifying the VECSEL structure, as the output coupler and active mirror can be integrated in the single closed casing. The injection of the pumping beam can be realized by the fiber connected directly to it. The whole VECSEL can be then treated as a portable ferrule integrated with the fiber. They can also be completed by a HCG combined with diamond layer 3 as top mirror, reflecting the pump diode laser and transparent to the VECSEL emission in the case the pumped and emitted beams are collinear.

Figure 2:
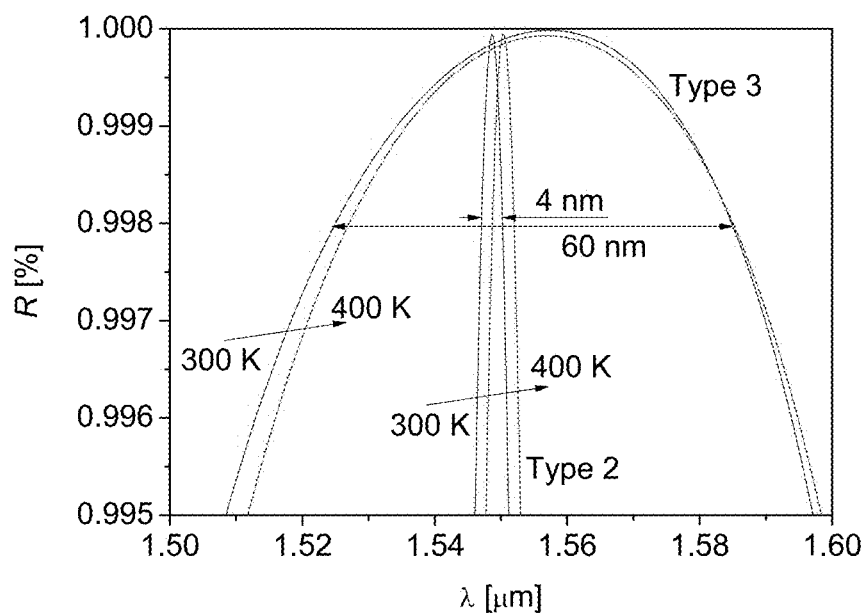
FIG. 2 illustrates the reflection spectrum of Si HCG buried in diamond (Type 2) and Si HCG deposited on diamond (Type 3) at 300 K and 400 K

FIG. 2 illustrates the reflection spectrum of Si HCG buried in diamond (Type 2) and Si HCG deposited on diamond (Type 3) at 300 K and 400 K.

Second element of the proposed invention, next to the bottom diamond layer 5, is the high contrast grating 6 or 7, mentioned above. Typically such mirror is realized as uniformly spaced stripes of the high-index material surrounded by the air [ref 7]. In such structure the reflectivity above 99.8% can be achieved over the wavelength range of around 80 μm. HCG 6, 7 is dominantly exploited as a high speed tuning mirror in tunable VCSELs [ref 7]. In the designs considered here the HCG 6, 7 should be integrated with the diamond to reduce the risk of mirror degradation by thermal strains under high power lasing regimes. The drawback of HCG integration with higher refractive index materials is the bandwidth reduction of the reflection spectra.

FIG. 2 presents the reflection spectra of Si grating embedded in diamond (Type 2) and deposited on diamond surrounded by the air (Type 3). The calculated reflection of HCG for pumping light is close to 15%, which reduces the reflection losses of pumping beam from the device interface with respect to the uncoated device. The HCG used in the Type 3 assures very broad spectrum and it is insignificantly varying with the change of the temperature, hence the design can be predominantly used in high power regimes. In Type 2, where silicon stripes are embedded in diamond, such configuration provides much lower contrast of refractive indices than silicon in air. The consequence of such design is a very narrow reflection spectrum, which is higher than 99.8% only in the range of 4 nm. Narrow spectral reflection is not only the drawback, since it can be used as a filter of longitudinal modes and stabilizer of emitted wavelength, since the reflection peak shifts with temperature as slow as 0.02 nm/K. Furthermore, it is possible to consider the Type 2 pumped from the bottom. The material parameters used in our calculations are summarized in Table 2 and Table 3.

TABLE 2

Thermal parameters used in the calculations

| Material | Thermal conductivity [W/(K m)] | Reference |
|---|---|---|
| Diamond | 1200 | [ref8[1]] |
| InP | 71 | [ref9[2]] |
| AlInGaAs | 4 | [ref10[3]] |
| GaAs | 45.4 | [ref11[4]] |
| Al0.9Ga0.1As | 26.3 | [ref11[4]] |
| Si | 148 | [ref12[5]] |
| In | 81.63 | [ref13[6]] |
| Cu | 400.8 | [ref14[7]] |

TABLE 3

Optical parameters used in the calculations

| n | Refractive index @ 1550 nm | dn/dT [1/K] | Reference |
|---|---|---|---|
| Diamond | 2.39 | $1 \cdot 10^{-5}$ | [ref15[8]] |
| Si | 3.48 | $1.72 \cdot 10^{-4}$ | [ref16[9]] |
| GaAs | 3.374 | $3 \cdot 10^{-4}$ | [ref17[10]] |
| Al$_{0.9}$Ga$_{0.1}$As | 2.9386 | $1.5 \cdot 10^{-4}$ | [ref17[10]] |

Figure 3:
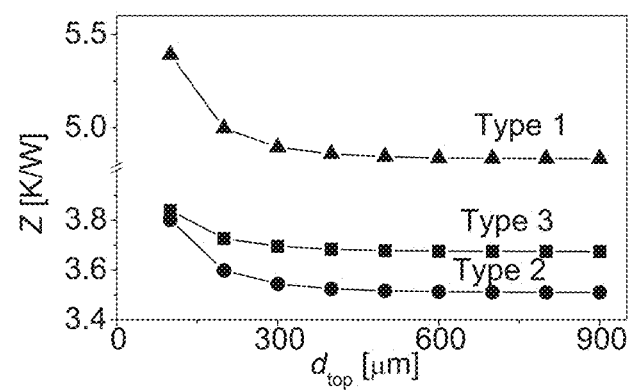
FIG. 3 illustrates the thermal impedance (Z) of three types of VECSELs as a function of top diamond heat spreader thickness.

FIG. 3 illustrates the thermal impedance (Z) of three types of VECSELs as a function of top diamond heat spreader thickness and illustrates the optimization of thickness of top diamond heat-spreader with respect to the thermal impedance of the active mirror. The thermal impedance is defined as a ratio between the increase of the maximum temperature in the device induced by the increase of the absorbed power wasted for non-radiative recombination:

$$Z = \frac{\Delta T_{max}}{\Delta P_{nrad}} \quad (1)$$

All three types reveal the reduction of the thermal impedance with the increase of top diamond thickness and they tend to a constant value in the infinity. The thermal impedance of Type 1 is significantly larger than one of Type 2 and Type 3. Comparing the last two cases, it is evident that Type 3 provides worse heat management since the heat has to be transported radially in the bottom diamond to go aside from 1 mm hole drilled in the copper heat-sink. However, the difference between Type 2 and Type 3 are not large, especially in comparison with Type 1.

The results show that top diamond layer 3 thickness of 300 μm is the minimal one assuring relatively small impedance, only 1% higher than the structure with the thickest analyzed diamond. Such optimal diamond thickness has been found for three analyzed VECSEL types. The diamond layer 3 positioned above active region plays a role of heat-spreader. It absorbs the heat from the active region, redistributes radially within the diamond and injects back to the cavity away from the laser axis, where the heat flow is less intense. The diamond heat-spreader 3 is responsible for broadening of the heat flow in the direction down to the heat-sink and ensures reduction of the temperature in the active region 2, which contributes to more effective heat transport to the copper 9 heat-sink. It is worth to mention that the top heat-spreader 3 does not transport the heat to the top copper element 9, which presses the diamond from top. The thermal impedance calculated with copper touching and not touching diamond heat spreader are only insignificantly different.

FIG. 3 illustrates the thermal impedance (Z) of three types of VECSELs as a function of top diamond heat spreader 3 thickness.

Figure 4:
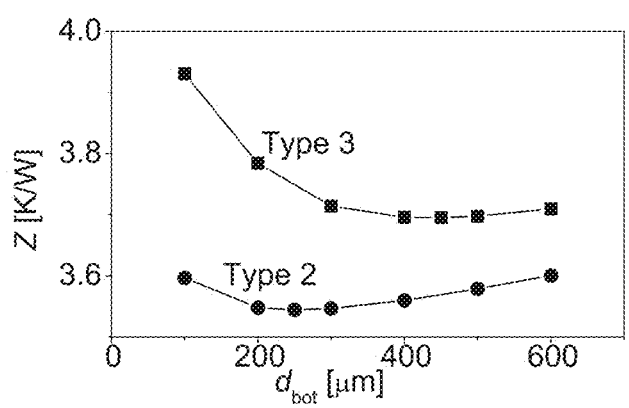
FIG. 4 shows the dependence of thermal impedance as a function of bottom diamond thickness for Type 2 and Type 3.

FIG. 4 shows the dependence of thermal impedance as a function of bottom diamond thickness 5 for Type 2 and Type 3. Only in those two designs we assumed a bottom diamond layer 5 combined with the HCG mirror 6, 7. The optimization has been performed for 300 µm top diamond which was found reasonable in previous analysis.

In FIG. 4 one can observe the minima of the thermal impedance, which are related to the competition between radial heat spreading and axial heat transport to the heat-sink. If all heat was spread by top diamond no reduction of thermal impedance would be observed for increase of the bottom diamond thickness. The minima reveal that part of the heat, which was not spread by the top diamond layer 3 must be spread by the bottom one 5, 6. For a thicker diamond more effective spreading occurs, however, on the other hand thickening of bottom diamond 5, 6 elongates the heat path to the heat-sink, which contributes to the deterioration of the heat management. Hence, in order to balance both mechanisms, bottom diamond layers 5 should be thick enough to enable efficient heat spreading and to not deteriorate the vertical heat transport.

In the case of Type 2 and Type 3 minimal thermal impedances are assured by 250 µm and 450 µm thick diamond layers, respectively. In Type 3 radial heat redistribution is more crucial, since the heat has to be transported aside from the copper hole. Hence, a thicker diamond layer 5 in Type 3 is required to assure effective heat dissipation with respect to Type 2.

FIG. 4 illustrates the thermal impedance (Z) of two types of VECSELs as a function of bottom diamond heat spreader 5 thickness.

Figure 5:
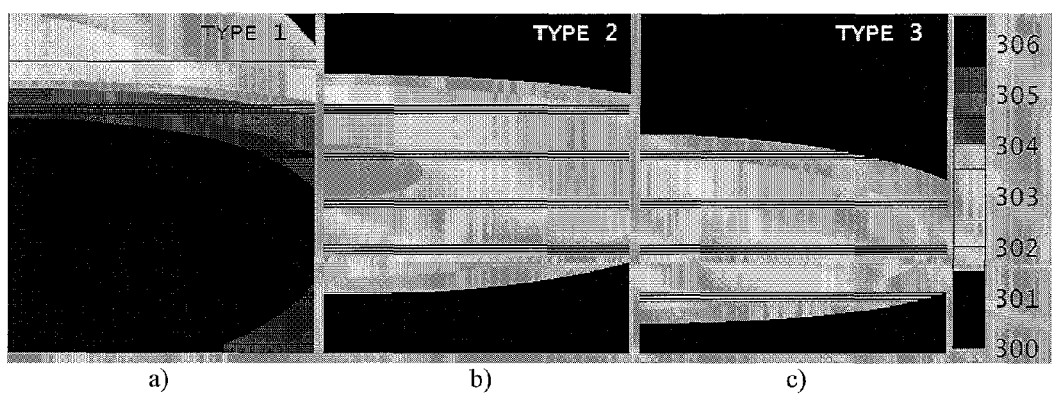
FIG. 5 illustrates the temperature distribution within the active region of three analyzed embodiments of VECSEL structures under 3 W power of input pumping beam

FIG. 5 illustrates the temperature distribution within the active region 2 of three analyzed types of VECSEL structures as described here above under 3 W power of input pumping beam. In type 1 the central region is at 306 K and top right corner close to 303K, type 2 has a "hot spot" in the center at a temperature of 304 and edges at a temperature of 302. For Type 3 the temperature in the center is 303 and edges are at 301 K The temperature in Type 1 is significantly higher than in two other types. In Type 1 the maximal temperature is located close to fourth group of quantum wells QWs (counting from top). Type 1 is pumped from top, which dominantly generates the heat in the upper part of the active region. The proximity of top diamond drains the heat from top part of active region and hampered heat transport through DBR 1 accumulates the heat in the lower part of the active region 2 which contributes to the position of the maximal temperature shifted downwards.

In Type 2 the maximal temperature is located close to second group of QWs (counting from top). Since the heat transfer through bottom 5 and top diamond layers 3 is equally efficient, the dominant factor determining the position of maximal temperature is the direction of the pumping beam 13.

Type 3 is the only design pumped from the bottom. Similar scheme of heat dissipation with respect to Type 2 favors the pump direction 12 as a factor determining the position of maximal temperature. In that case the maximum is located close to the fourth group of QWs.

One can notice that Type 3 operates at lower temperature under the same pumping power as Type 2. It is related to the pumping light escape from the structure. In Type 3, pump is injected from bottom, through the HCG 7, then part of the light is absorbed in the active region 2 and the rest leaves the cavity.

In Type 1 and Type 2 the light which was not absorbed by the active region 2 is reflected back by DBR 1, HCG 7 or by the interface of indium solder 9. The reflected light is absorbed in cavity. That mechanism contributes to the absorption of 98% of pumping light entering the active region 2.

In Type 3 one trip of pumping light through the cavity ensures only 88% absorption of input light. In the analysis presented in FIG. 3 and FIG. 4 the absorbed power contributed to thermal impedance.

FIG. 5 illustrates the temperature distribution in cavities of three types of VECSELs under 3 W pumping power entered to the device. The figures comprise the region from VECSEL axis (left side) to 180 µm from axis (right side) and from top diamond heat-spreader (top side) to InP cap layer (bottom side). The range of isotherms in K is shown on right.

The optimal designs of Type 1, Type 2 and Type 3 are defined by thermal impedances equal to: 4.84 K/W, 3.54 K/W and 3.69 K/W respectively. To determine the lowest theoretical limit of thermal impedance of such devices, the active region in the form of 180 µm disc has been buried in diamond and deposited on the copper heat-sink. The thermal impedance of such theoretical design has been found to be equal 3.27 K/W, which is only 8% less than thermal impedance of Type 2 and 13% less than Type 3. As it is well known form reliability assessment of the vertical cavity lasers, reducing the operating temperature of active material contribute in exponential increasing of the device life time [see reference 19]

FIGS. 5a-c show the reflection spectra of DBR 1 (FIG. 6a), HCG 5, 6 (FIG. 6b-c) and gain spectra of active regions 2 at 300 K and 400 K. It shows the sensitivity of reflection and gain spectra on temperature.

In the Type 1 not only the gain spectrum moves with the temperature but also spectrum of DBR 1 reflectivity. Both of them shift 0.5 nm/K, which ensures laser operation under broad range of ambient temperatures and causes that emitted wavelength is susceptible to temperature change [see reference 18].

In the case of Type 2 low contrast of refractive indices between diamond and silicon makes HCG reflection spectrum as narrow as 4 nm at R=99.8%, which can act as spectral filter. Additionally, almost insignificant thermal shift of the reflection spectrum stabilizes the emitted wavelength.

Type 3 provides broad enough reflection spectrum to cover the gain peak shift caused by 100 K temperature change. The reflection spectrum is also very stable under the change of the temperature. Additionally in the device working under high level of injection the generation of high temperature will not affect the change of the refractive indices of HCG, since HCG is placed far from the active region.

Figure 6:
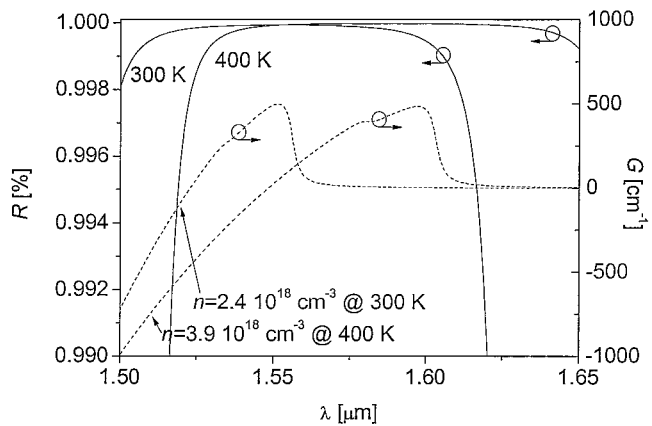
FIGS. 6a-c shows the reflection spectra of DBR.
Figure 6:
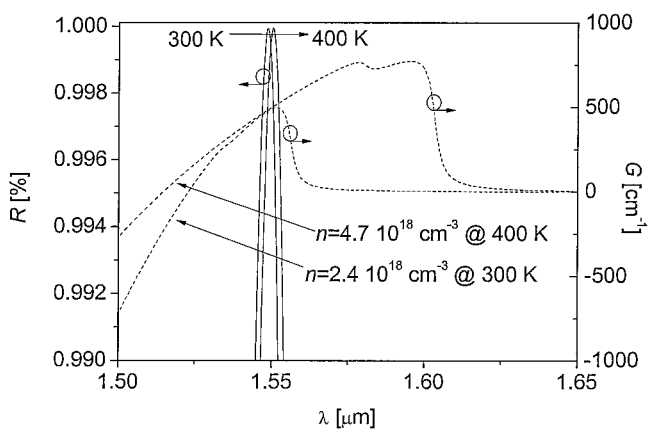
Figure 6:
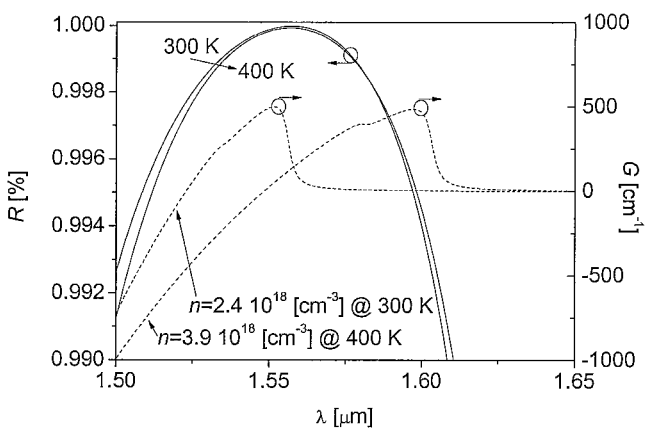

FIG. 6 illustrates the gain spectra (dashed line) and reflection spectra (solid lines) of bottom mirrors at 300 K (blue) and 400 K (red) for VECSEL designs: a) Type 1, b) Type 2, c)

Type 3. In Type 1 and Type 3 gain spectra has been calculated to keep gain peak at the same level at different temperatures. In Type 2 gain was kept constant for the peak of reflection spectrum.

The above description provides exemplary embodiments only, and is not intended to limit the scope, applicability, or configuration of the claims. Rather, the description will provide those skilled in the art with an enabling description for implementing the described embodiments, it being understood that various changes may be made in the function and arrangement of elements without departing from the spirit and scope of the appended claims.

Also the examples and values given herein are only for illustrative purposes and should not be construed in a limiting manner. Different embodiments of the invention may be combined together according to circumstances. In addition, other embodiments and applications may be envisaged for example by using equivalent means.

REFERENCES

All Incorporated by Reference in their Entirety in the Present Application

[1] M. Kuznetsov, F. Hakimi, R. Sprague, A. Mooradian "Design and Characteristics of High-Power (0.5-W CW) Diode-Pumped Vertical-External-Cavity Surface-Emitting Semiconductor Lasers with Circular $TEM_{00}$ Beams" IEEE J. Sel. Top. Quantum Electron. vol. 5 pp 561-573, 1999

[2] C. F. R. Mateus, M. C. Y. Huang, Y. Deng, A. R. Neureuther, C. J. Chang-Hasnain "Ultrabroadband Mirror Using Low-Index Cladded Subwavelength Grating" IEEE Photon. Technol. Lett., vol. 16, pp. 518-520, 2004

[3] M. Amann "Tuning triumph" Nat. Photon. vol. 3 pp 27-28, 2009

[4] M. Dems, R. Kotynski, and K. Panajotov, "Plane wave admittance method—A novel approach for determining the electromagnetic modes in photonic structures," Opt. Express., vol. 13, pp. 3196-3207, 2005

[5] R. P. Sarzala and W. Nakwaski, "Optimisation of the 1.3-μm GaAs-based oxide-confined (GaIn)(NAs) vertical-cavity surface-emitting lasers for their low-threshold room-temperature operation," J. Phys: Condens. Matter, vol. 16, pp. S3121-S3140, 2004

[6] A. Sirbu, A. Mereuta, A. Caliman, N. Volet, Q. Zhu, V. Iakovlev, J. Rautiainen, J. Lyytikainen, O. Okhotnikov, J. Walczak, M. Wasiak, T. Czyszanowski, E. Kapon "High power optically pumped VECSELs emitting in 1310-nm and 1550-nm bands" Proceedings of SPIE, DOI 10.1117/12.874838 (2011)

[7] C. Chase, Y. Zhou, C. J. Chang-Hasnain "Size effect of high contrast gratings in VCSELs" Opt. Express., vol. 17, pp. 24002-24007, 2009

[8] T. R. Anthony et. al. "Thermal diffusivity of isotopically enriched $^{12}C$ diamond", Phys. Rev. B, vol. 42, pp 1104-1111 (1990)

[9] W. Nakwaski "Thermal conductivity of binary, ternary and quaternary III-V compounds" J. Appl. Phys., vol. 64, pp. 159-166 (1989)

[10] J. Piprek, J. K. White, A. J. SpringThorpe IEEE J. Quant. Electr. vol. 38, pp 1253-1259 (2002)

[11] S. Adachi "GaAs, AlAs, and Al(x)Ga(1-x)As: Material parameters for use in research and device applications" Journal of Applied Physics, vol. 58, pp. R1-R29 (1985)

[12] C. J. Glassbrenner and G. A. Slack, "Thermal conductivity of silicon from 3 K to the melting point" Phys. Rev., vol. 134, pp. A1058-A1069 (1964)

[13] R. J. Sladek, "Thermal Conductivity Of Indium-Thallium Alloys At Low Temperatures" Phys Rev vol. 97, pp 902-15 (1955)

[14] N. V. Zavaritskii, A. G. Zeldovich, "Thermal Conductivity Of Technical Materials At Low Temperatures" Zh. Tekh. Fiz. vol. 26, pp 2032-6 (1956)

[15] W. J. Tropf, M. E. Thomas "Infrared Refractive Index and Thermo-optic Coefficient Measurement at APL" Johns Hopkins APL Technical Digest, vol. 19, pp. 293-298 (1998)

[16] B. J. Frey, D. B. Leviton, T. J. Madison "Temperature-dependent refractive index of silicon and germanium" Proc. SPIE vol. 6273, p. 62732J (2006)

[17] S. Gehrsitz, F. K. Reinhart, C. Gourgon, N. Herres, A. Vonlanthen and H. Sigga "The refractive index of $Al_xGa_{1-x}As$ below the band gap: Accurate determination and empirical modeling" J. Appl. Phys. vol. 87, pp 7825-7837 (2000)

[18] N. Schulz, J.-M. Hopkins, M. Rattunde, D. Burns, J. Wagner "High-brightness long-wavelength semiconductor disk lasers" Laser & Photon. Rev. vol. 2 pp 160-181 (2008)

[19] G. Suruceanu, A. Mereuta, J-C. Charlier, A. Sirbu, V. Iakovlev, A. Caliman and E. Kapon. Wafer fused 1.3 μm Waveband VCSELs and their reliability. http://lpn.epfl.ch/eslw2011/program.php

The invention claimed is:

1. A vertical-cavity laser (VCL) comprising at least a reflector, an active region, a first heat spreader attached to a first side of the active region, and a second heat spreader attached to a second side of the active region, the first and second heat spreaders sandwiching the active region, wherein the first and second heat spreaders comprise the same thermal conductive material, wherein the first and second heat spreaders are each in direct contact with the active region, wherein the first and second heat spreaders comprise diamond, wherein the reflector and the first heat spreader comprise a high contrast grating, wherein the high contrast grating of the first heat spreader is located on an outer surface of the first heat spreader.

2. The laser as defined in claim 1, further comprising a thermal conductive material that is diamond.

3. The laser as defined in claim 1, further including a Si high contrast grating.

4. The laser as defined in claim 1, further including a heat sink, wherein the heat sink is a copper support.

5. The laser as defined in claim 4, wherein the copper support has an opening for allowing the passage of a pumping beam.

6. The laser as defined in claim 5, wherein said VCL is formed in a vertical-external cavity surface emitting laser (VECSEL) configuration or in a vertical cavity surface emitting laser (VCSEL) configuration.

7. The laser as defined in claim 1, wherein the high contrast grating is a buried high contrast grating.

8. The laser as defined in claim 1, wherein the second heat spreader comprises a high contrast grating.

9. The laser as defined in claim 8, wherein the high contrast grating of the second heat spreader is located on an outer surface of the second heat spreader.

10. The laser as defined in claim 9, wherein a pumping beam and an emitted beam are oriented in a same direction along a VCL axis from the first heat spreader side.

11. The laser as defined in claim 1, further including a heat sink, in contact with both the first and second heat spreaders, to receive heat from the first and second heat spreaders.

12. A Vertical-External Cavity Surface Emitting Laser (VECSEL) or Vertical Cavity Surface Emitting Laser (VC- SEL), comprising a Vertical Cavity Laser (VCL), wherein the VCL comprises at least a reflector, an active region, a first heat spreader attached to a first side of the active region, and a second heat spreader attached to a second side of the active region, wherein the first and second heat spreaders sandwich the active region and comprise the same thermal conductive material, wherein the first and second heat spreaders are each in direct contact with the active region, wherein the first and second heat spreaders comprise diamond, wherein the reflector and the first heat spreader comprise a high contrast grating, wherein the high contrast grating of the first heat spreader is located on an outer surface of the first heat spreader.

13. The laser as defined in claim 12, wherein the second heat spreader comprises a high contrast grating.

14. The laser as defined in claim 13, wherein the high contrast grating of the second heat spreader is located on an outer surface of the second heat spreader.

15. The laser as defined in claim 14, wherein a pumping beam and an emitted beam are oriented in a same direction along a VCL axis from the first heat spreader side.

16. The laser as defined in claim 12, further comprising a thermal conductive material that is diamond.

17. The laser as defined in claim 12, further including a Si high contrast grating.

18. The laser as defined in claim 12, further including a heat sink, wherein the heat sink is a copper support.

* * * * *